United States Patent [19]

Freyman et al.

[11] Patent Number: 5,006,673
[45] Date of Patent: Apr. 9, 1991

[54] FABRICATION OF PAD ARRAY CARRIERS FROM A UNIVERSAL INTERCONNECT STRUCTURE

[75] Inventors: Bruce J. Freyman, Sunrise; Barry M. Miles, Plantation; Jill L. Flaugher, Margate, all of Fla.

[73] Assignee: Motorola, Inc., Schaumburg, Ill.

[21] Appl. No.: 447,349

[22] Filed: Dec. 7, 1989

[51] Int. Cl.$^5$ ............................................. H05K 3/00
[52] U.S. Cl. ................................... 174/255; 174/260; 174/263; 174/264; 29/846
[58] Field of Search ................... 29/846; 174/255, 262, 174/260, 263, 258, 264

[56] References Cited

U.S. PATENT DOCUMENTS 4,700,473 10/1987 Freyman et al. ............... 174/255 X
4,710,592 12/1987 Kimbara ............................... 174/262

Primary Examiner—Leo P. Picard
Assistant Examiner—Trinidad Korka
Attorney, Agent, or Firm—Juliana Agon

[57] ABSTRACT

A method of manufacturing a chip carrier from a universal ceramic substrate provides for a universal ceramic substrate having first and second opposed sides and an array of conductively filled through-holes. On the first side, wire bond pads and conductors connected to the conductively filled through-holes are provided as required. Similarly, on the second side, solder pads on the conductively filled through-holes are provided as required. Finally, at least one insulating layer is provided over part of the first side for die attachment.

20 Claims, 3 Drawing Sheets

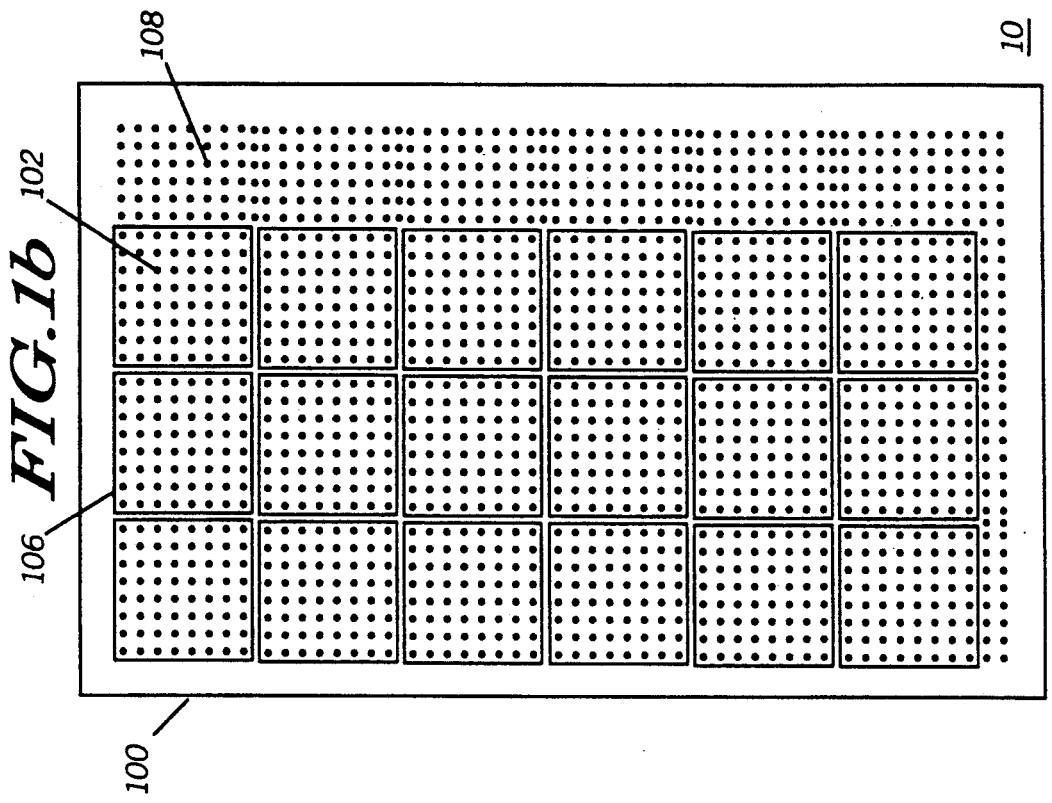
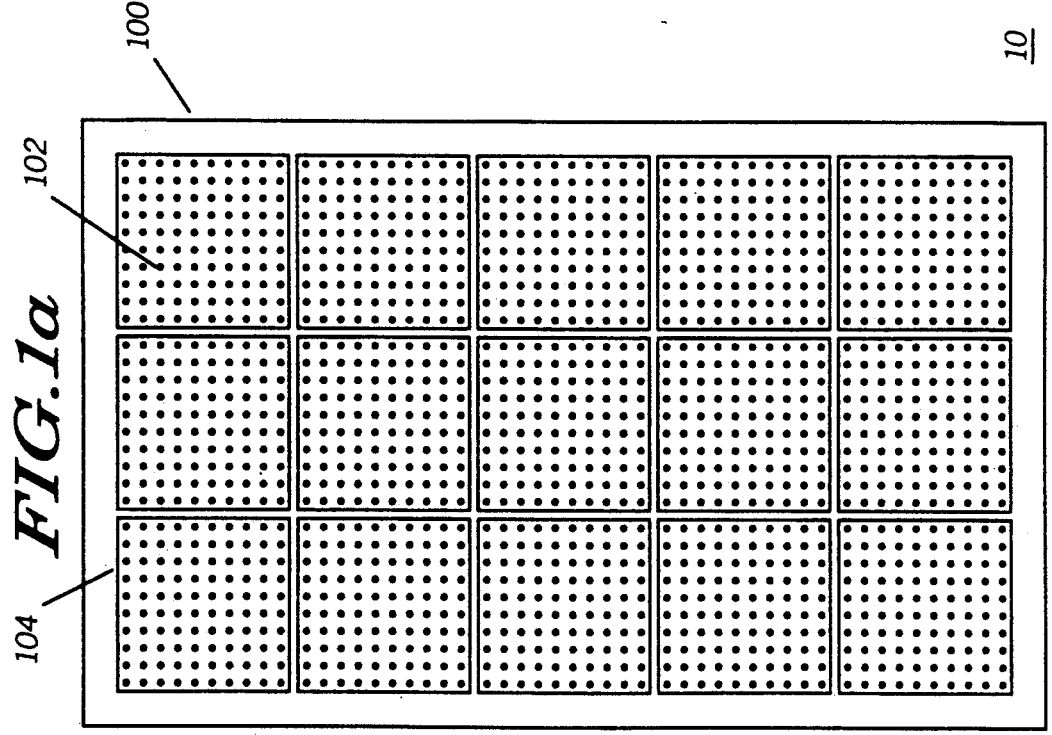

FABRICATION OF PAD ARRAY CARRIERS FROM A UNIVERSAL INTERCONNECT STRUCTURE

BACKGROUND OF THE INVENTION

This invention relates generally to a method of making an ultra high density pad array chip carrier and more particularly to a method for making a variety of high density pad array chip carriers from a universal structure.

With the increasing size of large scale integrated circuit chips the number of input and output connections that have to be made to a chip has correspondingly increased. This trend has encouraged the evolution to smaller and more dense leadless chip carriers. Leadless chip carriers generally consist of a package containing a square plate of ceramic such as alumina which forms a substrate or base onto which a chip is mounted. Electrical connection paths within the leadless chip carrier allow the leads of the chip to be brought to external contact pads formed around each of the four sides of the ceramic base of the carrier. The carrier is then surface mounted, usually onto a generally larger printed circuit (PC) board, or other ceramic board simply by placing the carrier on top of the corresponding contact pads, which mirror those contact pads of the chip carrier. An electrical and mechanical connection is then made by soldering the chip carrier to this generally larger board by reflow soldering. This arrangement allows greater density of input and output connections to be achieved.

Disadvantages do, however, arise with leadless chip carriers because of the way in which they are connected to a board. Since the leadless chip carrier is rigidly joined to a generally larger PC board or ceramic board and lacks any ability to accommodate relative movement between the carrier and the board onto which it is mounted, if the chip carrier and board are of materials having different coefficients of thermal expansion, changing in temperature will cost differential expansion of the two components. This induces strain on the solder connections which can cause failure of the electrical and mechanical connection, especially after repeated thermal cycling. However, it is known that small ceramic chip carriers operate more reliably in a thermal cycling environment than larger chip carriers, expecially when these are mounted onto a printed circuit board, therefore it is clear that if the designer seeks to improve the overall reliability of a mounted ceramic chip carrier package, the designer must attempt to reduce the size of the chip carrier.

One known arrangement for a pad array or pad grid array chip carrier utilized thick film techniques to form a pattern of screened-on metallic paste on the surface of an unfired ceramic substrate. Through-holes in this ceramic substrate are filled with a conductive glass-metal paste combination and are connected with electrical conductors formed by the pattern of screened on metallic paste. The ceramic substrate then has a second ceramic layer added beneath it having contact pads on its bottom surface and separated from the conductors and die mount pad on the first ceramic layer. These co-fired pad array carriers use co-fired metallization not only to fill the through-holes but also to form the conductors and die attach area. The size and density realizable for such a co-fired chip carrier, while utilizing the center area beneath the die mount pad, is limited by the additive co-fired process itself in that the narrowest conductor which can be screened is 5 mils or milli- inches with a typical production width being 8 mils wide. Such constraints limit the size and density posssible for a chip carrier manufactured using this co-fired method and they in turn can strain further desired improvements in reliability and in cost. Therefore, a need exists to reduce the use of these expensive co-fired techniques, which necessarily limit the minimum possible size of the chip carrier arrangement and which in turn affect the reliability as well as the per unit cost.

Furthermore, the co-firing process with the conventional pad array design, requires the need to buy a custom punching tool for every new pad array chip carrier design. Often, one punching tool is needed for the top layer, while another one is required for the bottom layer. With this design, as the number of input/output ports changes, the amount of inventory of the resultant customized carriers required to accommodate the different number of ports is high. Therefore, a need exists to standardize the method of making the ultra high density pad array chip carrier while reducing production costs and production time of making an ultra high density pad array chip carrier.

BRIEF SUMMARY OF THE INVENTION

Accordingly, it is an object of the present invention to provide a method for making a variety of ultra high density pad array chip carriers from a standard universal interconnect structure.

Briefly, according to the invention, a method of manufacturing a chip carrier from a universal ceramic substrate provides for a universal ceramic substrate having first and second opposed sides and an array of conductively filled through-holes. On the first side, wire bond pads and conductors connected to the conductively filled through-holes are provided as required. Similarly, on the second side, solder pads on the conductively filled through-holes are provided as required. Finally, at least one insulating layer is provided over part of the first side for die attachment.

BRIEF DESCRIPTION OF THE DRAWINGS

FIGS. 1a–b are illustrations of a universal interconnect structure in accordance with the present invention.

DESCRIPTION OF THE PREFERRED EMBODIMENT

Figure 2A:
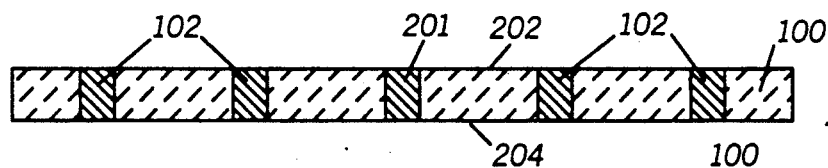
FIGS. 2a–j are a series of cross-sectional views of a process sequence of the universal interconnect structure in accordance with the present invention.
Figure 2B:
Figure 2C:
Figure 2D:
Figure 2E:
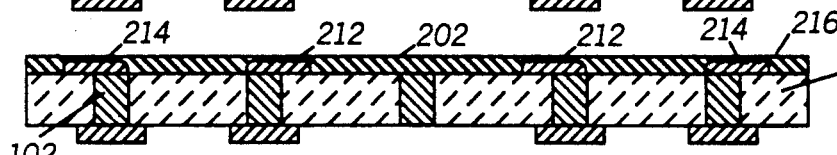
Figure 2F:
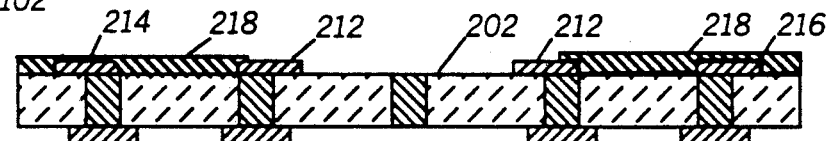
Figure 2G:
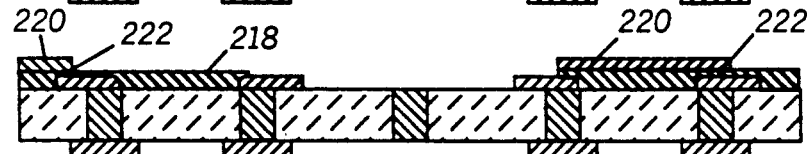
Figure 2H:
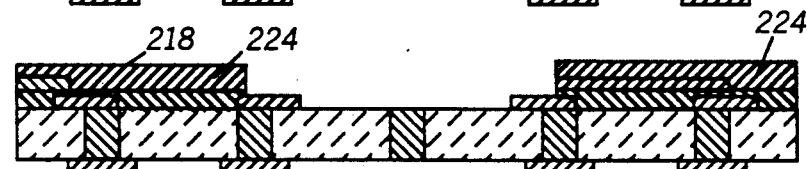
Figure 2I:
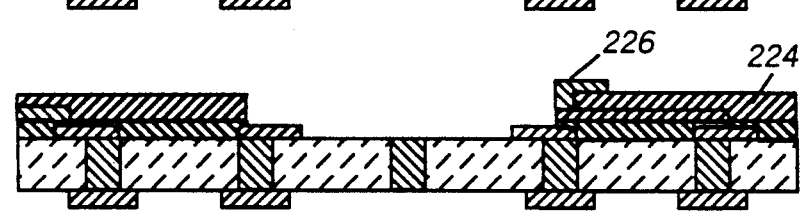
Figure 2J:
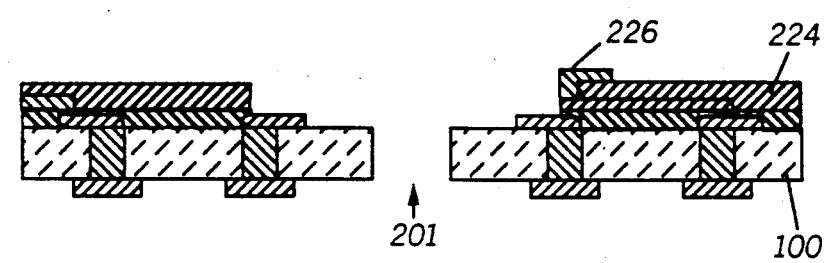

Referring to the drawings and first to FIGS. 1a–b, an alumina ceramic substrate 100 having an uniformly spaced matrix of conductively filled through-holes 102 is shown. Through-holes 102 are formed (such as by punching) and filled with a conductive paste (such as tungsten/glass) prior to the firing of the substrate and provide electrical continuity from the front to the back of the substrate. Since all of the filled through-holes have the same center-to-center spacing, only one punching tool is required. The common starting point of any pad array carrier design can then be fabricated from this universal interconnect structure 10 that has conductively filled through-holes. Referring to FIG 1a, 15 high density pad array chip carriers 104 having 100 input/output ports can be fabricated from the universal interconnect structure 10. Utilizing the same universal structure 10 as illustrated in FIG. 1b, 18 high density pad array chip carriers 106 having 64 input/output ports can be accommodated. According to the invention, the universal substrate 10 can be partitioned to sections (104 or 106) to accommodate a wide variety of high density pad array chip carriers. Any unused portions of the substrate, such as the unused holes 108 can be masked off to accommodate the particular high density pad array chip carrier desired.

Referring to FIG. 2, a process is shown for making a high density array in accordance with the present invention. In step 2a, the ceramic layer consisting of the alumina substrate 100 is provided to have an array of conductively filled through-holes 102 connecting the first side 202 to the second side 204 of the substrate 100. Multiple pad array carriers may be fabricated from one universal interconnect structure 10 by permitting one row of unused conductively filled through-holes 201 to partition or isolate one chip carrier from another. Alternately, the chip carriers may be partitioned between two used holes as illustrated in FIGS. 1a-b.

Figure 4:
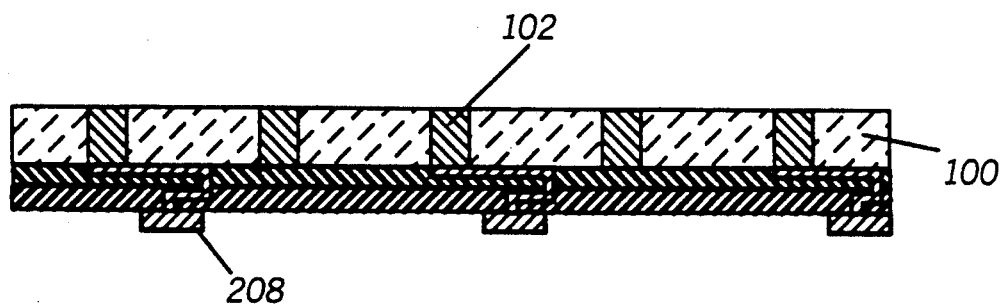
FIG. 4 is a cross-sectional view of the present invention utilizing a bottom metallized dielectric layer to customize a desired solder pad spacing.

Proceeding to step b of FIG. 2, a first metallized layer 206 is applied to the second side 204 of the alumina substrate 100 as by using conventional thin-film vacuum metallization techniques. In step c of FIG. 2, this metallized surface is then processed (or photo delineated, electro-plated with copper, nickel, and gold and then etched) to form solder pads 208 for any solder pad center spacing as desired. If the solder pad center spacing does not coincide with the center-to-center spacing of the universal structure 10, a dielectric layer (such as polyimide) may be applied, metallized, and photodelineated on the second side of the substrate to form the desired solder spacing as seen in FIG. 4. The individual solder pads 208 remain electrically connected to the conductively filled through-holes 102 directly (or if necessary, by a conductive runner). A second metallized layer 210 is applied to the alumina substrate 100 in step d of FIG. 2 and is similarly further processed (or delineated, electro-plated and edged) in step e of FIG. 2 to form individual wire bond pads 212 on the first side 202 if desired, and conductors 214, if desired, which interconnect with some of the conductively filled through-holes 102. A dielectric material 216 such as photosensitive polyimide is then applied over the metallized first side 202 of the substrate 100 (and to cover any other area as desired). The use of this 12 micron polyimide dielectric layer decreases the thickness of the overall package compared to conventional co-fired packages which typically uses 11 mil thick alumina dielectic material between metal layers. Referring to step f of FIG. 2, the polyimide layer 216 is then similarly processed (or photo delineated) to form a dielectric layer 218 over the conductors 214 in the center of the carrier for die attachment. The resultant patterned universal interconnect structure is now ready for separation into the individual chip carriers.

If desired, optional steps may be added before separation. If necessary, the die attached area 218 can be metallized (220) in a subsequent metallization and photo delineation step and a metallized via 222 etched through the dielectric layer 218 in step g of FIG. 2 to provide additional routing of conductive runners (or to form another wire bond pad on top of the dielectic layer or grounding as desired). A second polyimide dielectric layer 224 may be optionally applied and delineated over the die attached area 218 (and to cover any other area as desired) in step h of FIG. 2. Likewise, an optional additional metallized pattern and via can be formed on top of the second dielectric layer 224 to form conductive routing 226, (or yet another wire bond pad on top of the dielectric layer or grounding), if necessary in step i of FIG. 2. Furthermore, if desired, an optional additional metallized pattern and via can also be formed on the second side of the substrate as on the first side underneath a dielectric layer to form solder pads for any solder pad center spacing desired and previously described in FIG. 4. Finally, the resultant patterned universal interconnect structure is then separated (such as by sawing) into the individual pad array chip carriers in step j of FIG. 2. The unused conductively filled through-holes 201 which separate the carriers on the pattern universal interconnect structure 100 can now be discarded. The metallized (226) dielectric layer 224 in each chip carrier is then ready to have a semiconductor chip attached.

Figure 3:
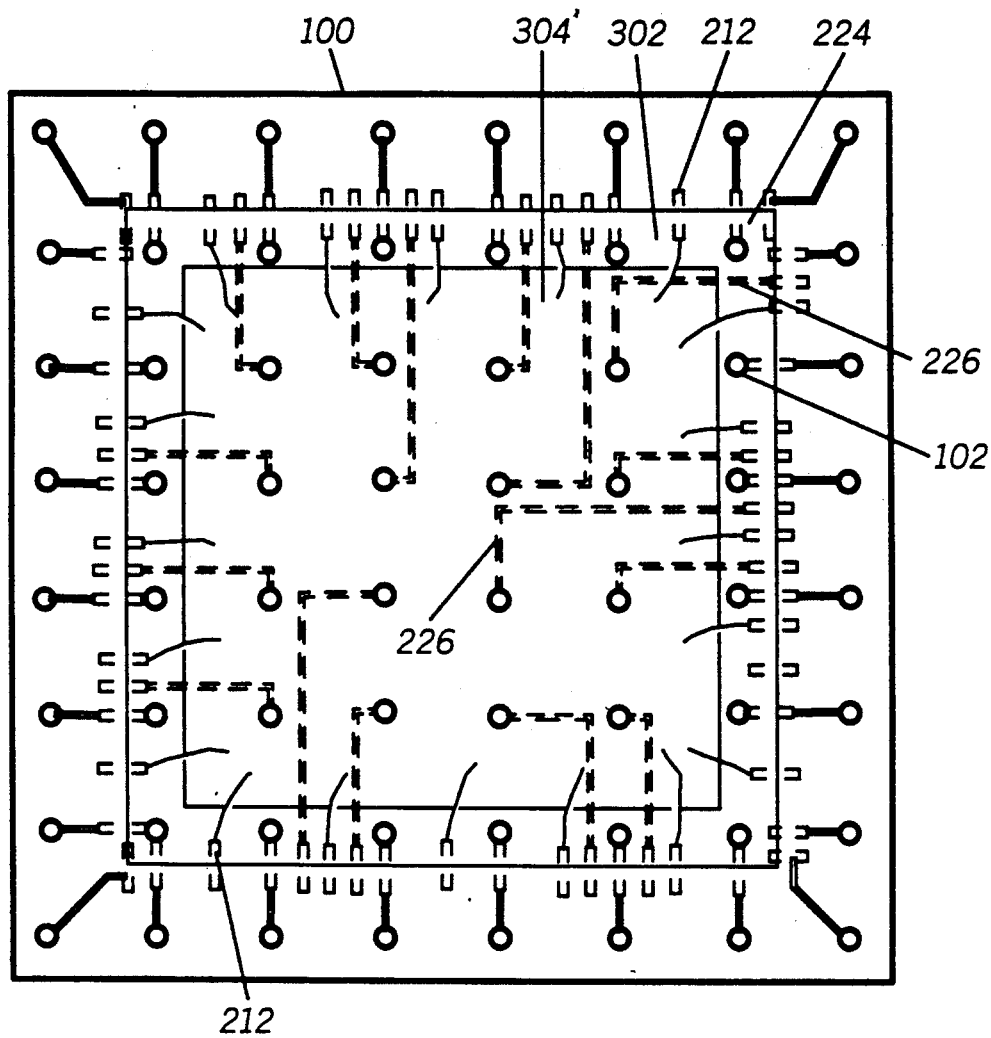
FIG. 3 is top plan view of a chip carrier utilizing the ceramic substrate prepared according to the process of FIGS. 2a–j.

Referring to FIG. 3, a top view of the pad array chip carrier arrangement, according to the invention, shows the bond wires 302 are utilized for interconnecting to a semiconductor chip 304 after it is mounted on the metallized dielectric layer 224. The through-holes 102, conductive runners 226 and parts of the wire bond pads 212, underneath the die or dielectric layer are shown with dashed lines as much as possible.

In summary, different pad array chip carrier designs can be fabricated from one universal interconnect structure. The conductively filled through-holes in the universal interconnect structure provides connections to conductors, die mount pads, and solder pads in any position as required and on any layer of the metallized insulating material as desired. In achieving this maximum flexibility, not all of the conductively filled holes within the chip carrier have to be used.

We claim:

1. A method of manufacturing a chip carrier from a universal ceramic substrate, comprising the steps of:
   providing a universal ceramic substrate having first and second opposed sides and an array of conductively filled through-holes pre-formed prior to a firing of said universal ceramic substrate;
   providing wire bond pads and conductors connected to said conductively filled through-holes as required on said first side;
   providing solder pads on said conductively filled through-holes as required on said second side; and
   providing at least one insulating layer over part of said first side for die attachment.

2. The method according to claim 1, wherein said step of providing solder pads on said conductively filled through-holes on said second side comprises the step of applying conductive material to form said solder pads.

3. The method according to claim 1, wherein said step of providing wire bond pads and conductors connected to said conductively filled through-holes on said first side comprises the step of applying at least two metallized dielectric layers on said first side.

4. The method according to claim 1, wherein said step of providing at least one insulating layer over part of said first side for die attachment comprises the steps of applying and delineating at least one dielectric layer into the size of the intended semiconductor die mount pad and to cover any other desired area.

5. The method according to claim 4, wherein said step of providing at least one insulating layer further comprising the step of metallizing one surface of said at least one dielectic layer.

6. The method according to claim 4, wherein said step of providing at least one insulating layer comprises the step of applying polyimide to said first side of said universal ceramic substrate.

7. The method according to claim 1, wherein said step of providing a universal ceramic substrate comprises masking off the area around a desired section of said universal ceramic substrate to accommodate one of a wide variety of semiconductor chips.

8. The method according to claim 1 further comprising the step of severing off said desired section from said universal ceramic substrate to accommodate one of a wide variety of semiconductor chips.

9. The method according to claim 1 further comprising providing at least one insulating layer under part of said second side.

10. A method of manufacturing a plurality of chip carriers from a universal ceramic substrate, comprising the steps of:
   providing a universal ceramic substrate having first and second opposed sides and an array of conductively filled through-holes pre-formed prior to a firing of said universal ceramic substrate which is able to accommodate an arbitrary design of said plurality of chip carriers depending on connections of said through-holes;
   partitioning said universal ceramic substrate into an arbitrary quantity of sections depending on an arbitrary quantity of ports desired;
   metallizing and delineating wire bond pads and conductors connected to said conductively filled throug-holes as required on said first side;
   metallizing and delineating solder pads on said conductively filled through-holes as required on said second side;
   applying dielectric material and delineating at least one insulating layer over part of said first side for die attachment; and
   severing said universal ceramic substrate into said sections for forming said plurality of chip carriers.

11. The method according to claim 10, wherein said step of applying dielectric material and delineating at least one insulating layer further comprising the step of metallizing and forming a metallized via through one surface of said insulating layer.

12. The method according to claim 10 wherein said step of severing comprises sawing.

13. The method according to claim 10, wherein said step of partitioning comprises the step of masking-off an area around said plurality of sections on said universal ceramic substrate having said array of conductively filled through-holes, formed by punching and applying a tungsten/glass paste thereto.

14. The method of claim 10 wherein said step of providing a universal ceramic substrate comprises providing said universal ceramic substrate having an array of uniformly spaced conductively filled through-holes.

15. A chip carrier, comprising:
   a universal ceramic substrate having first and second opposed sides and an array of conductively filled through-holes pre-formed prior to a firing of said universal ceramic substrate;
   wire bond pads and conductors connected to said conductively filled through-holes as required on said;
   solder pads connected to said conductively filled through-holes as required on said second side; and
   at least one insulating layer applied over part of said first side for die attachment.

16. The chip carrier of claim 15 wherein said conductively filled through-holes are uniformly spaced in said universal ceramic substrate.

17. The chip carrier of claim 15 further comprising at least one insulating layer applied under part of said second side for customizing a desired solder-pad spacing.

18. The chip carrier of claim 15 wherein said at least one insulating layer comprises at least one metallized dielectric layer for forming any desired pattern.

19. The chip carrier of claim 15 wherein said chip carrier further comprising at least one metallized insulating layer applied under part of said second side for customizing a desired solder-pad spacing.

20. The chip carrier of claim 18 wherein said at least one insulating layer comprises a top metallized dielectric layer including a via formed over said at least one metallized dielectric layer for routing conductive runners to at least one of said through-holes.

* * * * *

UNITED STATES PATENT AND TRADEMARK OFFICE
CERTIFICATE OF CORRECTION

| | |
|---|---|
| PATENT NO. : | 5,006,673 |
| DATED : | April 9, 1991 |
| INVENTOR(S) : | Freyman, et al |

It is certified that error appears in the above-identified patent and that said Letters Patent is hereby corrected as shown below:

Column 5, line 36, delete "throug-holes" and insert therefor
-- through-holes --

Column 6, line 22, delete "said;" and insert therefore
-- said first side; --

Signed and Sealed this

Twenty-eighth Day of September, 1993

Attest:

BRUCE LEHMAN

*Attesting Officer*        *Commissioner of Patents and Trademarks*